United States Patent [19]

Bricaud et al.

[11] Patent Number: 4,555,153

[45] Date of Patent: Nov. 26, 1985

[54] CONNECTOR COMPRISING AT LEAST ONE CONTACT HAVING A RESILIENTLY DEFORMABLE ARM

[75] Inventors: Hervé Bricaud, Plaisir; Patrick L'Henaff, Thiais, both of France

[73] Assignee: Socapex, Suresnes, France

[21] Appl. No.: 581,709

[22] Filed: Feb. 21, 1984

[30] Foreign Application Priority Data

Feb. 25, 1983 [FR] France ............................ 83 03131

[51] Int. Cl.⁴ .......................................... H01R 23/72
[52] U.S. Cl. .............................. 339/17 CF; 339/217 S
[58] Field of Search .............. 339/17 CF, 174, 217 S, 339/258 R, 258 P, 176 M, 176 MP

[56] References Cited

U.S. PATENT DOCUMENTS 3,015,083 12/1961 Juris ................................. 339/258 P
3,947,083 3/1976 Ahmed et al. ................... 339/258 P
4,334,727 6/1982 Scheingold et al. ........... 339/17 CF

FOREIGN PATENT DOCUMENTS 30763 6/1981 European Pat. Off. .
2315484 10/1974 Fed. Rep. of Germany .
2230337 1/1975 Fed. Rep. of Germany ... 339/17 CF
2656920 6/1978 Fed. Rep. of Germany .
2219605 9/1974 France .

Primary Examiner—Neil Abrams

[57] ABSTRACT

A connector having at least one contact with a resiliently deformable arm, inserted longitudinally in a socket formed in an insulating block and having longitudinal generatrices, and comprising: a body cooperating with at least one edge of the socket so that, once the contact has been inserted, it has a longitudinal axis substantially parallel to the direction of the generatrices of the socket; an output terminal disposed at a longitudinal end of the body of the contact and extending beyond the socket; an extention forming an abutment for the contact on the insulating block in the direction of insertion of the contact; and a resilient tongue cooperating with a stopping face of a retention cavity disposed in the socket so as to form an abutment in the direction opposite the direction of insertion of the contact; the resiliently deformable arm being disposed at the other longitudinal end of the body and extending beyond the socket.

25 Claims, 25 Drawing Figures

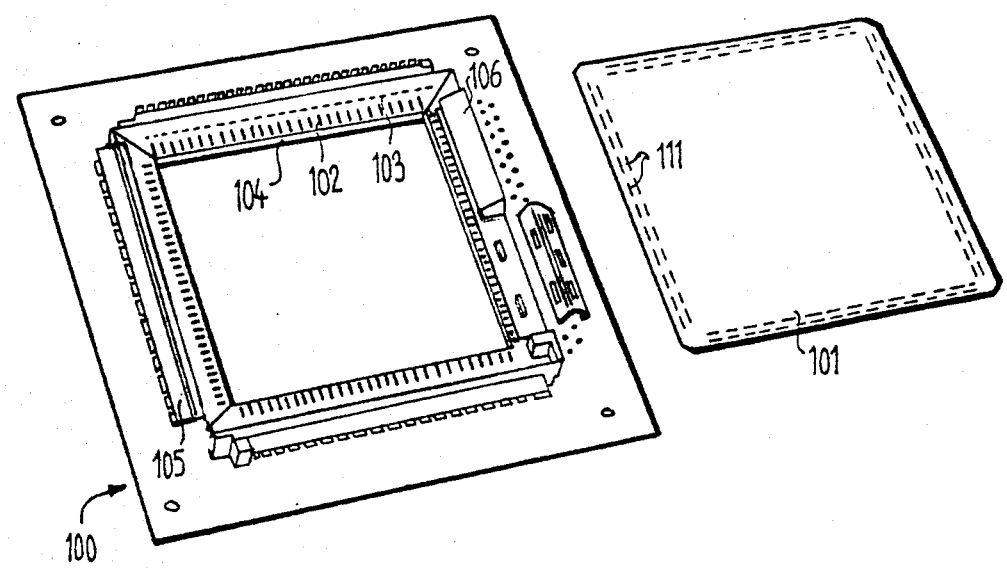
FIG_1
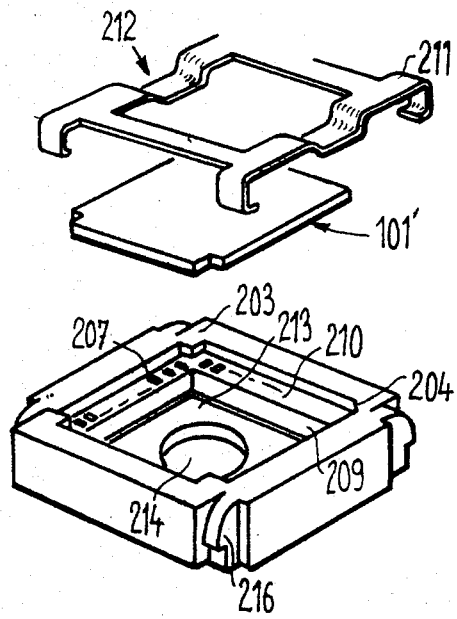
FIG_2-a
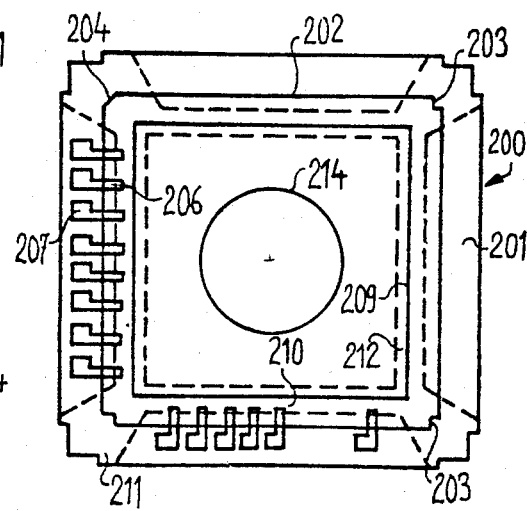
FIG_2-b

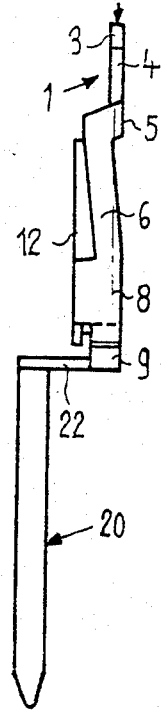
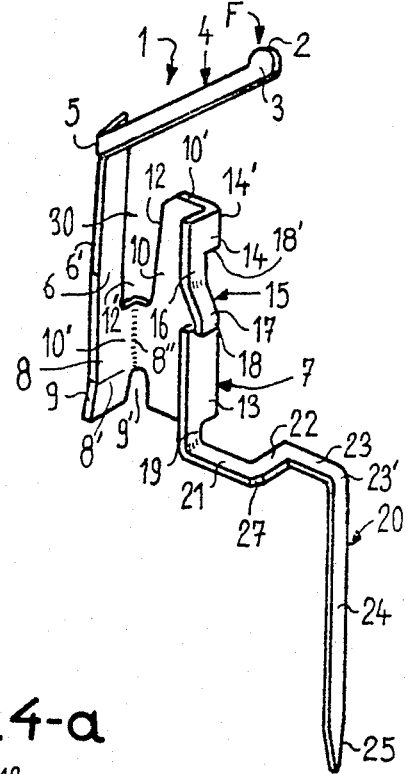
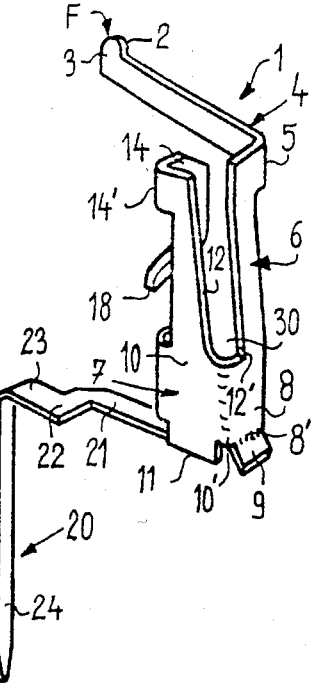
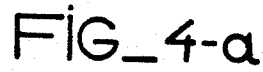
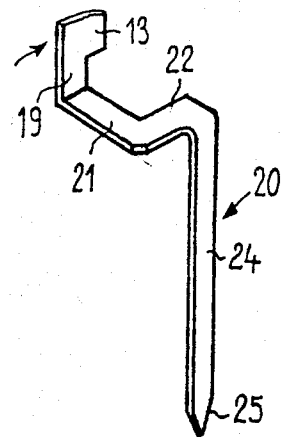
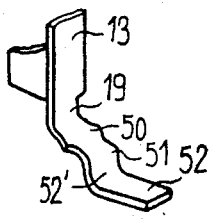
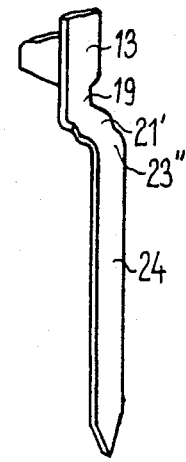

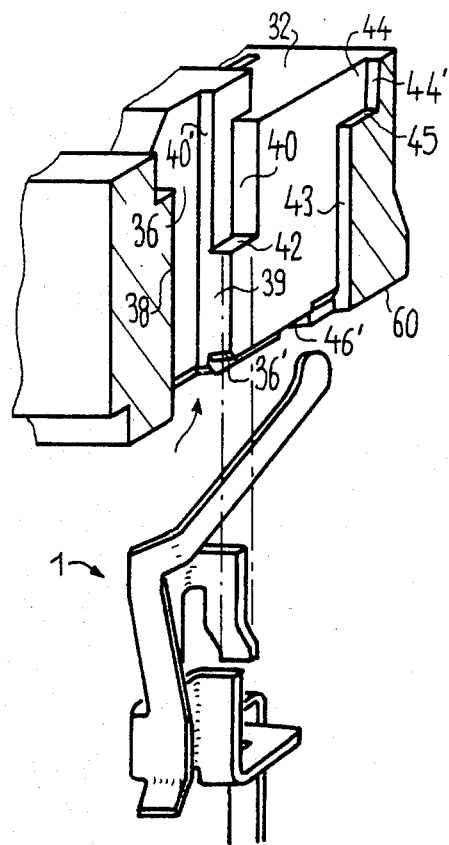
FIG_6-a
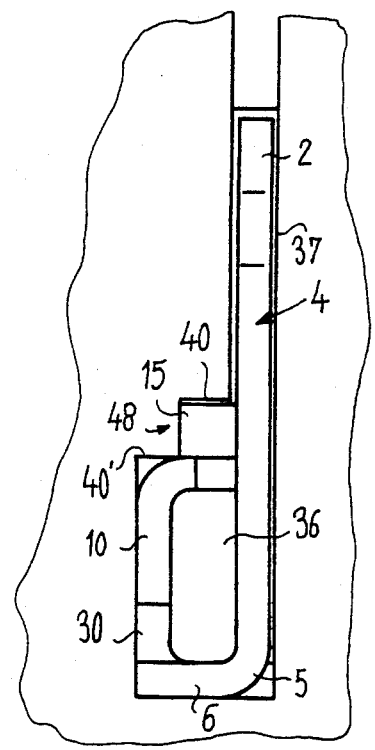
FIG_6-b
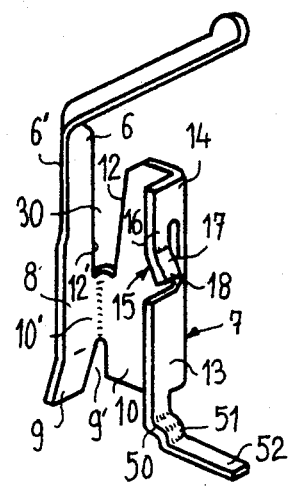
FIG_5

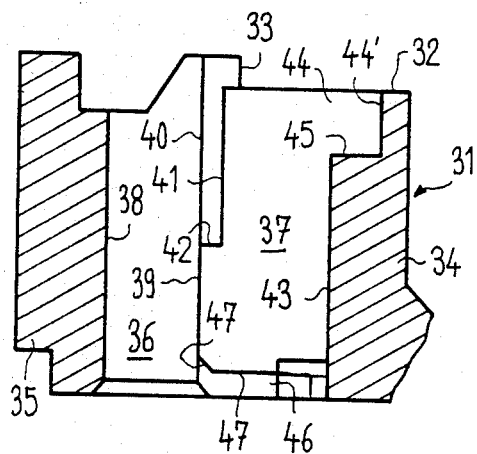
FIG_7-a
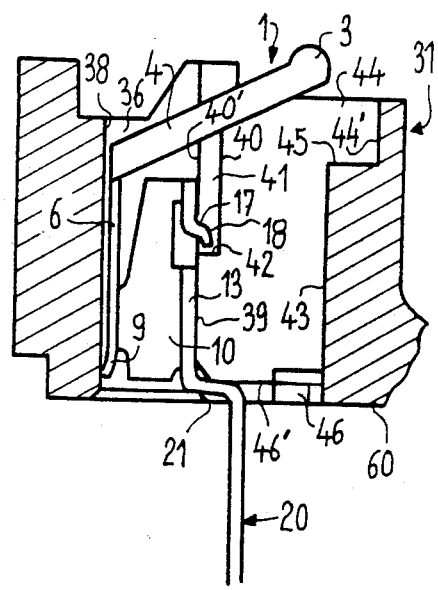
FIG_7-b
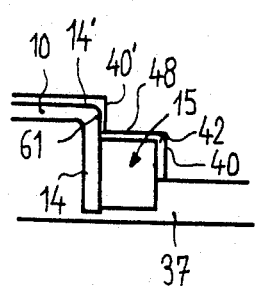
FIG_7-c
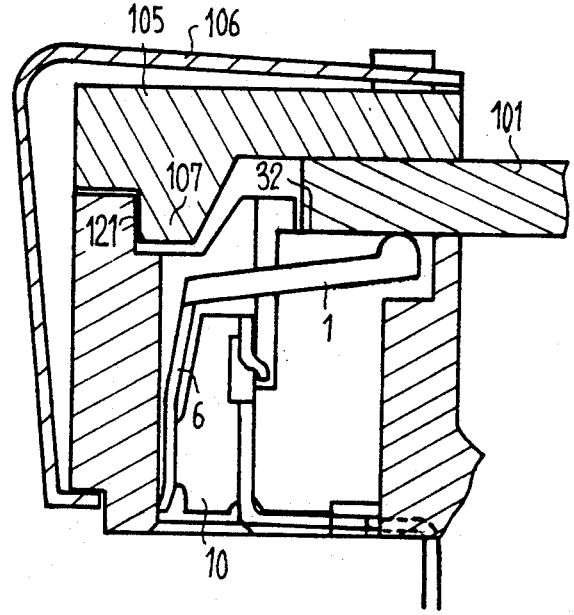
FIG_7-d

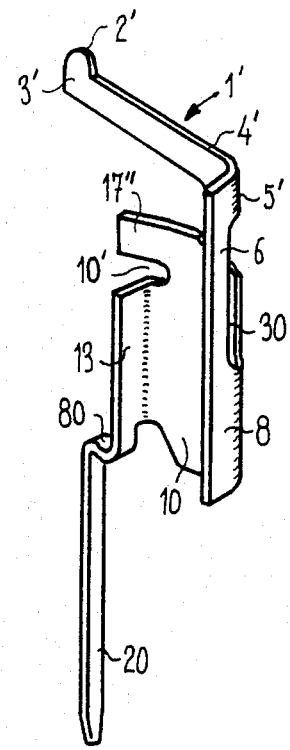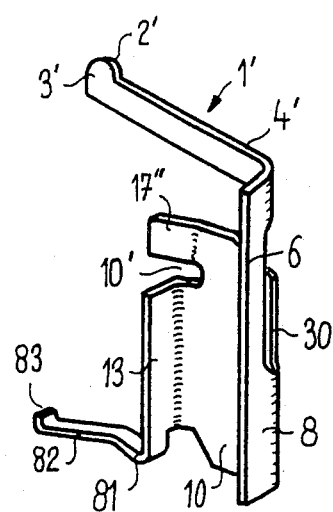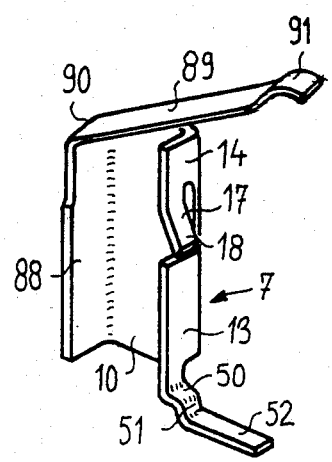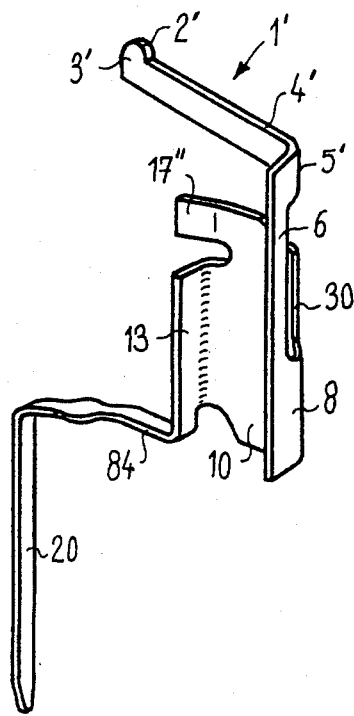

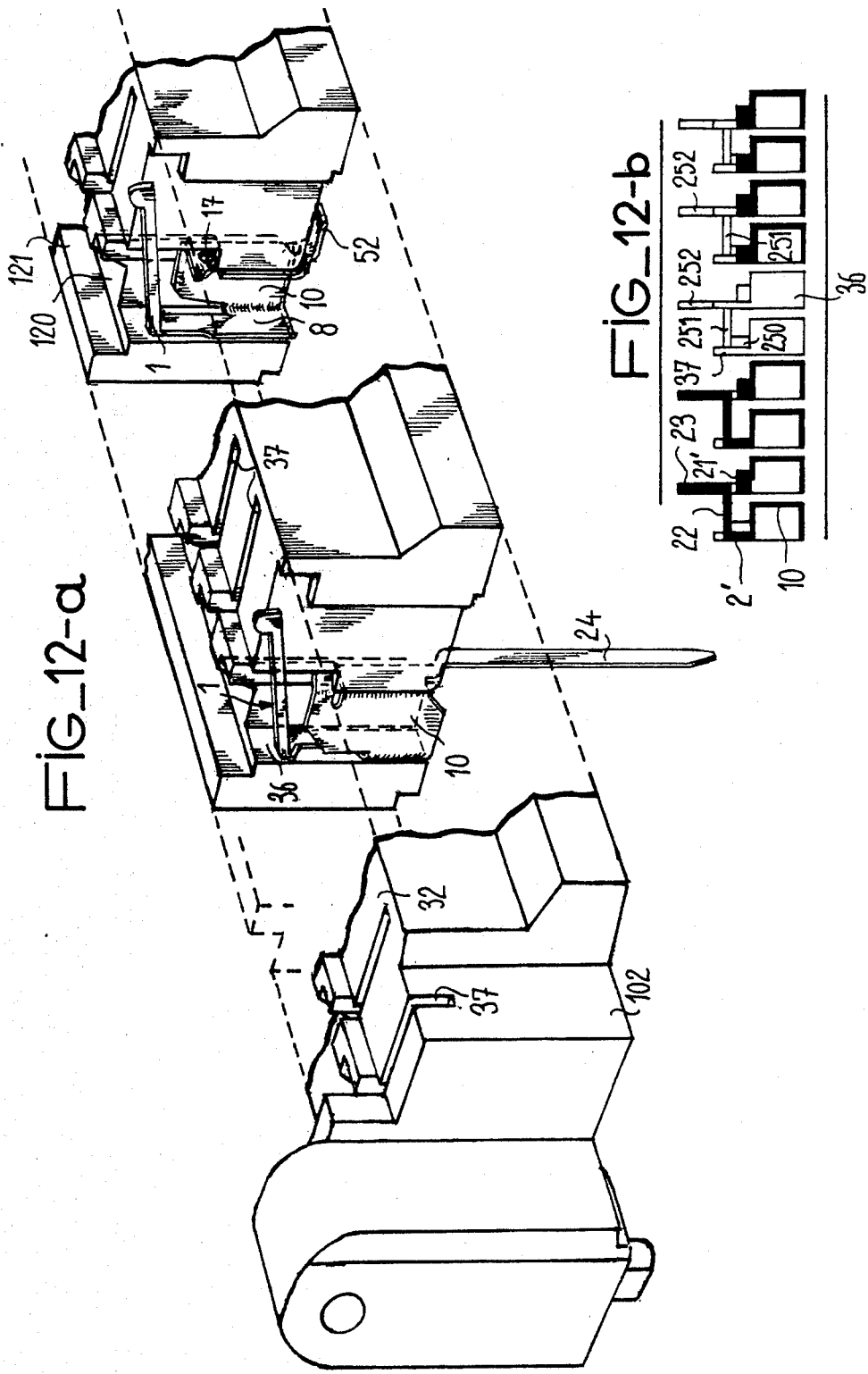

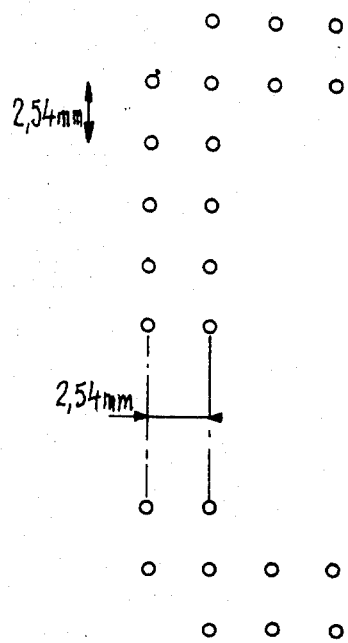
FIG_13
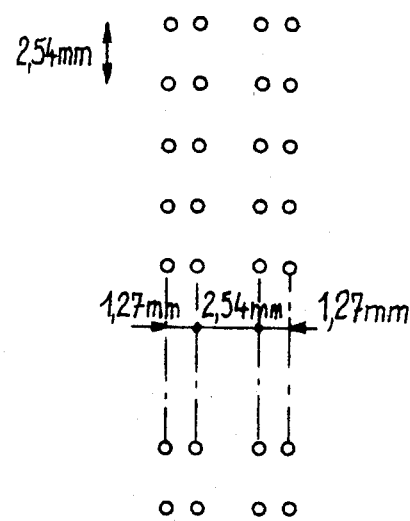
FIG_14
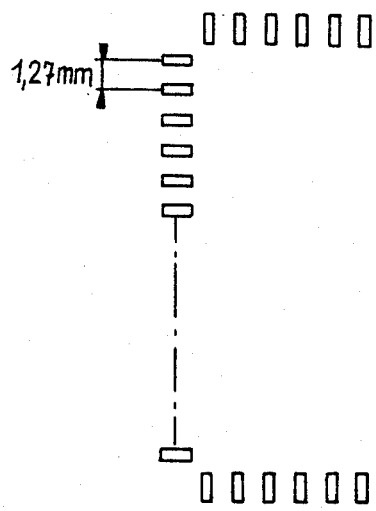
FIG_15

CONNECTOR COMPRISING AT LEAST ONE CONTACT HAVING A RESILIENTLY DEFORMABLE ARM

BACKGROUND OF THE INVENTION

1. Field of the Invention

The present invention relates to a connector comprising at least one contact having a resiliently deformable arm exerting a bearing force opposite the direction of insertion of an object to be inserted and being more particularly suitable to the connection of a printed circuit of said object to be inserted, this latter being a substrate having contact studs or fingers disposed flat such as the ceramic substrates of the hybrid circuits and by extension the microcases with peripheral connections, known under the name of chip carriers. Such contacts are generally called "zero insertion force contacts" in opposition to sliding contacts.

2. Description of the Prior Art

Such connectors are known in the Prior Art for example from the European patent application No. 34 081 filed on the Jan. 27, 1981 by the applicant in which the circuit to be connected is held in position by a resilient shaped piece which bears resiliently on a pivoting cap. The pressure force exerted on the cap is sufficient to overcome the resilience of the contacts.

However, the formation of the contacts properly speaking poses a number of problems. On the one hand, these connectors are capable of receiving a very high number of individual contacts whose cost per unit must be as low as possible. On the other hand, the force exerted by the contacts must be as uniform as possible.

Contacts have been proposed which are inserted through the lateral faces of the connector and are held in place by molding and coating with a bonding agent, which makes the manufacture thereof delicate and costly. These contacts have the further drawback of supporting the whole of the weight of the circuit which is connected thereto, this latter being positioned solely by bearing on resilient zones of the contacts. Such a structure has then the drawback that the bearing forces of the individual contacts on the circuit are not homogeneous from one contact to another and from one edge to the other of a circuit. These forces depend both on the precise position of the end of a contact, which is difficult to ensure with high accuracy because of the manufacturing process used, on the thickness of the substrate and on the homogeneity of application of the bearing force transmitted to the circuit to be connected.

SUMMARY OF THE INVENTION

The present invention provides then a connector of the above mentioned type comprising at least one contact and which does not have the above cited drawbacks. In a connector in accordance with the invention, the contacts are inserted longitudinally and are automatically locked in position at the end of insertion without the contact being able to be removed by exerting a pulling force. No bonding or over-molding is then necessary. Furthermore, the resilient part of a contact intended for cooperation with the circuit to be connected extends over a given distance from the insulating body which then serves as abutment for the substrate to be connected.

The invention thus relates to a connector comprising at least one contact having a resiliently deformable arm exerting a bearing force in a direction opposite the direction of insertion of a substrate, wherein said contact is of a type which is inserted longitudinally substantially parallel to the direction of insertion of the substrate in a socket formed in an insulating block and having longitudinal generatrices and comprises:

a. a body cooperating with at least one edge of the socket so that, once the contact has been inserted, it has a longitudinal axis substantially parallel to the direction of the generatrices of the socket;

b. an output terminal disposed at one longitudinal end of the body of the contact and extending from the socket;

c. an extension forming an abutment for the contact on the insulating block in the direction of insertion of the contact;

d. a resilient tongue cooperating with a stopping face of a retension cavity disposed in the socket so as to form an abutment in the direction opposite the direction of insertion on the contact once this latter has been inserted; and said resiliently deformable arm is disposed at the other longitudinal end of the body of the contact and extends from the socket, said socket opening at this location on a flat face forming an abutment for the substrate.

The contact is consequently positioned in its socket on the one hand through the guiding function of the body of the contact and at least one edge of the socket and, on the other hand, by the two above mentioned abutment surfaces.

In a variant, the output terminal of the contact comprises, at the level of connection thereof with the body of a contact, a bend forming the abutment extension. This arrangement has the advantage, on the one hand, of causing the contact terminal to fulfil an additional abutment function and, on the other hand, of making it possible for the output terminal to move away from the longitudinal axis of the contact so as to facilitate insertion of the contact into the socket and to allow the output terminal of the contact to be disposed at the desired distance from the socket. For example, said bend may comprise at least two legs, which allows the output terminal to move substantially away from the socket.

The resiliently deformable arm may comprise a crook forming an electrical contact zone.

The socket may comprise a slit for guiding the resiliently deformable air which allows free passage thereof during guiding and provides transverse guiding thereof. Ths slit may comprise a zone forming a safety abutment for the resiliently deformable arm. This arrangement is particularly advantageous for it avoids destruction of the contact which might occur if the resiliently deformable arm were accidently pushed inwardly of the slit whereas normally, in the working position, its contact zone must be flush with the surface of the insulating body. The abutment forming zone may be formed for example by a set-back disposesd on a transverse wall closing said slit.

In a preferred embodiment, the resiliently deformable arm comprises a lever extending from the socket and a spring arm disposed in a direction substantially parallel to the longitudinal axis of the body of the contact. The lever may be connected to the spring arm by a bending zone disposed at the free end of the spring arm and on a lateral edge thereof. The axis of the spring arm may, according to a particularly advantageous embodiment, be slightly slanted laterally with respect to the longitudinal axis of the body so that the median plane of the lever passes substantially through the middle of the zone connecting the spring arm to the body of the contact. Thus the beam formed by the spring arm operates under optimum mechanical conditions.

The lever may form an obtuse angle with the spring arm, so that the maximum extension of the lever inside the socket is obtained at the end thereof.

The spring arm may be separated from the body of a contact by a slit. This arrangement is particularly advantageous in that the slit may be used for receiving an electric contact tip of a testing device without any interaction with the spring arm at the output terminal.

The resilient retention tongue may be orientated in the longitudinal direction of the body of the contact. The retention cavity may then have a flange running alongside the resilient retention tongue and cooperating with the lateral portion of the body of the contact so as to provide guiding of the body of the contact also at this level.

In a particularly advantageous variant, the connector has a resilient means for urging the body of the contact against the lateral wall of the socket. In a preferred embodiment, the resilient means is effective in urging the body of the contact simultaneously against said lateral wall and said flange running alongside the resilient tongue, which allows the guide length to be extended without increasing the length of the body of the contact.

In an embodiment facilitating guiding of the contact during compression thereof, the body of the contact has in section a general U shape with a bottom and two legs, at least one of the two legs being guided longitudinally over at least a part of its length by at least one lateral wall of the socket.

The resilient arm may have at least one portion parallel to the bottom of the body and extending from the edge of a leg of the contact body, this edge being opposite the bottom thereof.

The resilient retention tongue may be disposed on one of the legs of the U shaped body of the contact. The output terminal may be disposed at one end of one of the legs of the U shaped body of the contact. The resilient arm may be disposed at one end of one of the legs of the body of the contact. In particular, the output terminal and the resilient arm are situated on two different legs. In the case where the resilient arm comprises a lever and a spring arm, it is particularly advantageous for facility in manufacture of the contact for the lever to be connected to the spring arm by a bending zone situated on the lateral edge thereof opposite the bottom of the U.

Furthermore, the resilient retention tongue will be preferably disposed on the same leg as the output terminal on which the two abutment effects of the inserted contact will thus be concentrated coaxially.

The resilient means for urging the body of the contact against the lateral wall of the socket may be a resilient pressure tongue formed on one leg of the body of the contact, more especially the leg of the body of the contact opposite that which carries the first resilient tongue, which absorbs all the play and maintains the first resilient tongue in the stopping face of the retention cavity. The resilient pressure tongue may be disposed at one end of said leg of the body of the contact.

The insulating block may comprise at least one groove receiving the bend of the corresponding output terminal.

The invention also relates to a connector comprising a plurality of contacts disposed in at least one row. The contacts disposed in the same row may have output terminals where the bend is situated as close as possible to the body of the contact, alternating with output terminals whose bend has at least two legs so that the output terminals corresponding to said row are themselves disposed in two rows.

BRIEF DESCRIPTION OF THE DRAWINGS

The invention will be better understood from reading the following description given by way of non limiting example, with reference to the accompanying figures which show:

FIGS. 1 and 2a, in perspective, two given types of connectors to which the invention more particularly applies and FIG. 2b, a top view of FIG. 2a, with a constructional variant of the spring;

FIGS. 3a to 3c, respectively in a front perspective, in a rear perspective and in a side view, a preferred embodiment of a contact in accordance with the invention;

FIGS. 4a to 4c, variants of output terminals of the contacts shown in FIGS. 3a to 3c;

FIG. 5, a variant of the contacts shown above adapted to flat mounting of the connector on a printed circuit;

FIG. 6a, a perspective sectional view of a contact and of a socket before insertion of the contact;

FIG. 6b, a top view of a contact in a socket;

FIGS. 7a and 7b, in vertical section, a socket of a connector in accordance with the invention respectively before and after insertion of the contact and FIG. 7c a detail of FIG. 7a in a top view;

FIG. 7d, a section of a socket with its contact after fitting of a substrate according to a one row variation of the embodiment of FIG. 1;

FIGS. 8 to 11, four variants of a contact according to the invention;

FIG. 12a, in a perspective view with parts cut away, the contacts of FIGS. 8 and 9 each fitted in a socket of a connector in accordance with the invention;

FIG. 12b, a bottom view of a connector according to the invention in which the contacts are mounted in a row and illustrating the possibility of disposing the output terminals in one or two rows;

FIGS. 13 to 15, different possible variants of implantation on a printed circuit receiving a device in accordance with the invention.

DESCRIPTION OF THE PREFERRED EMBODIMENTS

In FIG. 1, the connector comprises four insulating blocks 104 carrying contacts whose output terminals are brazed to a printed circuit board 100 so as to provide electric continuity. Each insulating block 104 has two rows of contacts 102 and 103 elastically deformable and exerting a bearing force in a direction opposite the direction of insertion of a substrate. The four insulating blocks 104 are assembled together so as to form a square for receiving a substrate 101, for example a ceramic substrate carrying circuits and having at its lower part two rows of conducting studs 111. In FIG. 1, the substrate 101 is shown so that its lower face is visible. When the substrate 101 is mounted on the connector 100, flaps 105 are folded back thereagainst and are held in position by fastenings 106 formed by U shaped pieces such as described in European patent application No. 34 981. The flap 105 has a protuberance 107 (FIG. 7b) serving as abutment for absorbing the horizontal component of the force exerted by fastenings 106. The resilient parts of contacts 102 and 103 extend from the insulating block by a given distance, but when the substrate 101 is placed in position, it abuts against a flat surface of the insulating block which defines its geometric position precisely and allows the contacts to exert a well defined force against the corresponding metallization. This arrangement and more particularly the abutment of substrate 101 allows each contact to behave as if it were alone. Furthermore, each of the contacts is disposed in a socket opening onto the upper part of the insulating block 104 which allows the part of the contact disposed in the sockets to be used for carrying out tests as will be seen in the description hereafter.

In FIGS. 2a and 2b, the connector 200 comprises an insulating block having here a generally square shape and comprising at its periphery at least one row of contacts disposed in sockets 207 and each of which has a resilient arm extending from a guide groove 206. The ends of the resilient arms extending from the grooves 206 at the level of a housing 210 intended to receive a substrate 101' formed in general by a chip carrier with peripheral connection. Housing 210 has foolproof elements formed here by three corners 203 forming a reentrant dihedron and a fourth bevelled corner 204. Housing 210 is limited on the inside by a set back 209 opening onto a bottom 213 having an opening 214 allowing if need be contact of substrate 101' and more particularly of the components disposed thereon with a heat sink. The bottom of housing 210 is flat and serves as an abutment for substrate 101' which is mounted on the connector. As in FIG. 1, the individual contacts exert a given force on the corresponding metallizations of the substrate 101' solely by the geometry of the contact and each contact behaves as if it were alone. Substrate 101' is held in abutment by a spring 212, known per se, and which is applied from the top of the substrate 101'. Spring 212 has extensions 211 which allow it to be fixed on ramps 216 disposed on each of the edges of the insulating block 201.

Referring to FIGS. 3a to 3c, an electric contact in accordance with the invention comprises a U shaped body 7, whose longitudinal axis is by convention shown vertical, and having a bottom 10 and two legs, the first one referenced 8 being continuous and the second one comprising a lower part 13 and an upper part 14 situated in the same plane and separated by a resilient retention tongue 15. The second leg has at the end of its lower part 13 and output terminal 20 comprising successively a bending zone 19, and three horizontal branches respectively 21, 22 and 23 in which the central branch 22 is orthogonal to the other two and whose endmost branch 23 is extended by a vertical output lug 24 to which it is connected by a bending zone 23'. Lug 24 ends in a V shaped bevel 25 facilitating entry thereof into the holes of a printed circuit to which lug 24 is intended to be soldered. The upper part 14 of the second leg is connected to the upper part of the bottom 10 by a bending zone 14'. The upper part 14 is extended downwardly by the resilient tongue 15. The resilient tongue 15 has a resilient region 16 forming a spring constituting the lower extension of the upper part 14 of the second leg an inclined arm 17 forming a dihedron of about 150° with the resilient region 16 and a foot 18 turned approximately in the vertical direction and which ensures locking properly speaking of the tongue. Between tongue 15 and bottom 10 is located a slit 18'.

Leg 8 is extended at its upper part by a vertical spring arm 6. At its lower part, it is connected to a pressure tongue 9 by a bending zone 8' so that tongue 9 extends outwardly of leg 8.

The lateral border 6' of the spring arm 6 situated opposite the bottom of the U 10 has at its upper end a bending zone 5 about which is bent a lever 1 whose axis is slanting with respect to the horizontal (for example of the order of 80°) so that its end 2 forming a bump 3 is situated above the upper part 10' of the body 10 of the contact. The spring arm 6 is separated from body 10 by a slit 30 defined on one side by a wall 12' of the spring arm 6 opposite wall 6' and, on the other hand, by a wall 12 of the body of contact 10.

The mounting thus described of lever 1 with respect to the spring arm 6 is particularly advantageous. Lever 1 receives the vertical force of application of the substrate in the direction of arrow F during insertion thereof but remains relatively rigid since this force is directed along the upper lateral face 4 of lever 1. Furthermore, since force F has a vertical axis, that is to say along the axis of the spring arm 6, this latter is not subjected to any slicing force, but only to a bending moment, in other words the spring arm 6 operates practically under pure flexion, the longitudinal compression forces being negligible. In this case, the ideal form (beam of equal resistance) is an arm of equal width and equal thickness which allows a spring arm 6 to be formed having an optimum shape by simply cutting out from the leg 8 of the U.

The mechanical operation of the support arm 6 is preferably optimized by slanting the axis thereof with respect to the vertical so that the median plane of lever 1 passes practically through the middle of the spring arm 6 at the foot thereof. Thus, under the action of the bearing force F, the upper part 3 of the contact moves substantially in the vertical plane of lever 4 and the secondary deformations tending to move it away from this plane, under the effect of a reversal torque perpendicular to the plane of arm 6 are negligible and in practice compatible with slight play between lever 1 and the edges of a possible guide slit 37 (FIG. 6b). It will be in fact noted that any lateral flexion of the spring arm 6 is reflected with amplification by the existing lever arm and may adversely affect the correct alignment of the contact if it is too great.

It is also possible to give readily to lever 1 a shape, by stamping out, allowing it to function as a beam of equal resistance so as to cause it to participate in the flexion.

Such a beam may in fact be obtained by causing its thickness to vary parabolically, this thickness corresponding to the dimension of lever 1 taken in the vertical direction. Construction thereof is then possible simply by cutting out by stamping.

FIG. 4a shows a variant of FIGS. 3a to 3c in which section 23 of the output terminal has been omitted. This allows arm 24 to be brought nearer the body of the contact with a minimum modification of the stamping tools, so as to provide a contact with so called "medium" clearance as opposed to the contact with so called "long" clearance shown in FIGS. 3a to 3c.

FIG. 4b shows a "short" clearance contact, i.e. in which the arm 24 is situated practically in the extension of leg 13. A flange 21' obtained by bending at 19 and 23" serves as abutment for the contact in the insertion direction thereof.

FIG. 4c is a variant of the contact shown in FIGS. 3a and 3c in which the output terminal is adapted to the flat brazing or soldering of the connector or to a bearing contact on a printed circuit. For this, it has, from the bending zone 19, a short horizontal section 50 forming an abutment, then after bending at 51, a short vertical section 51 extended, after bending at 52', by a horizontal contact zone properly speaking 52 forming a flat contact.

FIG. 5 is a variant of the preceding contact for flat fitting, illustrating a variant of the resilient tongue formed as a simple blade 17' bent at 16 outwardly of branch 13 and whose end 18 provides locking.

In FIGS. 6a, 7a, 7b and 7c, the socket 31 in which is disposed, by way of illustration, a contact of the invention such as shown in FIG. 3a, for FIG. 6a and in FIG. 4b, for FIG. 7b, has a chimney 36 intended to receive the contact body 10 whose legs 8 and 13 slide with play along lateral walls respectively 38 and 39. Inlet chamfers 36' are provided at the lower part of chimney 36 for facilitating insertion of the contact. When the contact is in the inserted position, the foot 18 of the resilient tongue 17 is locked, except for a slight play, against the bearing face 42 of a retention cavity 41 defined by a vertical wall 40 emerging at the upper part of the socket, which allows the contact to be removed if required by introducing a tool into the retention cavity 41, this tool bearing on the arm 17 of the resilient tongue so as to move the bearing face 42 away therefrom. Furthermore, section 21 forms a bearing surface against the bottom 46' of a groove 46 formed in the lower part 60 of the insulating block 35. The resilient tongue 9 comes into abutment against the wall 38 of chimney 36 so as to urge leg 13 against the wall 39. In the improvements shown in FIG. 7c, guiding of the body of the contact provided by the pressure exerted by the spring 9 is extended to the upper part of leg 13 through a set-back 48 defining a vertical wall 40' extending wall 39 and running along the upper part 14 at the issue of the bending zone 14' at the level of which there exists a flat zone 61 of small width but sufficient to provide the guiding function. Thus, the contact will be held in position with the range of movement reduced to the minimum.

Lever 1 which extends laterally from body 10 is guided by a guide slit 37 defined laterally by a wall 43 having at its upper part a cavity 44 bordered by a vertical wall 44' and a horizontal wall 45 forming a safety abutment for the end 3 of lever 1. This design takes advantage of the fact that the deformed shape of the spring arm 6 in the working position is an arc of a circle (see FIG. 7d), and so that the movement of the end of lever 1 takes place by advancing towards the inside of cavity 44. During insertion of the contact in the socket, the lever 1 not receiving any stress is in a position of maximum extension and extends along wall 43.

In FIG. 6b, seen from above, it can be seen that socket 36 leaves free access to the body 10 of the contact. This property may be used for testing the contact without influencing the mechanical action thereof. For this, a test probe is introduced into slit 30.

FIGS. 8 to 10 show another embodiment of the contacts of the invention, respectively of the short type, of the flat contact type and of the long type. This embodiment does not comprise any resilient tongue 9, in other words the contact is held in position solely by the play, which should be as small as possible, existing between the body of the contact and the socket. In particular, when the legs of the U are cambered, a certain opening may be left for this latter so that the two legs of the U are held under pressure against the walls of the socket. Furthermore, a retention tongue 17'', fulfilling the same function as tongues 17 and 17' described above, extends laterally and is situated in the extension of bottom 10 at its upper part. Finally, a lever 1' similar to lever 1 extends from the edge of the spring arm 6 which is contiguous with the bottom 10 of the body of the contact, but arrangement thereof is moveover the same as for lever 1. Although these variants have been shown together, it goes without saying that they may be used in combination or separately.

FIG. 11 shows a variant of the contact of the invention, in which the resilient arm consists of a flexible blade 89 connected to a leg 88 of body 10 by a bend 90.

The contacts of the invention may be formed by stamping from a strip and bending. The shape of the contact described corresponds to a good optimization of the amount of material used.

FIG. 12a shows in perspective with part cut away the lay out of the contacts in a row in a connector of the type shown in FIG. 1. The same socket may receive different types of contacts, here a short contact or a flat contact which allows the same insulating block 102 to be used for different uses.

In FIG. 12b, the contacts are arranged in a row at the lever of the resiliently deformable arms, but in two rows at the level of the output terminals. For this, sockets 36 are grouped together in twos. For each group of two sockets, the lower face of the insulating block 102 has a groove 251 disposed between the slits 37 of the corresponding sockets and which is intended for passing the leg 22 of a contact therethrough. Furthermore, a groove 252 formed in the lower face of the insulating block is situated in the extension of slit 37, of one of the sockets of each group of two, so as to receive the leg 23 of a so called long contact. Thus, a short contact and a long (or medium) contact may alternate in sockets 37 so that the output terminals are arranged in two rows with a pitch double that of the contacts. The corresponding lay out of the metallized holes on the printed circuit is shown in FIG. 13 (pitch of 2.54 mm corresponding to a pitch of 1.27 mm at the level of substrate 101).

In FIG. 14, the contacts are arranged in two rows at the level of the resiliently deformable arms which are each divided into two at the level of the output terminals, this corresponding to a printed circuit having four rows of holes arranged with a pitch of 2.54 mm, the two endmost rows being separated from the adjacent row by a gap of 1.27 mm and the two central rows by a pitch of 2.54 mm. Thus, the sockets receive alternately a short contact and a medium contact.

FIG. 15 illustrates the arrangement of the conducting studs on the printed circuit, corresponding to an insulating block having contacts for flat brazing or bearing contact (FIGS. 5 and 11).

The invention is not limited to the embodiments described. Thus, rows having a smaller pitch at the level of the resiliently deformable arms may be obtained by disposing the sockets 36 head to tail and by interdigitating the grooves 37. The sockets may thus be disposed in two rows with a pitch of 1.27 mm enclosing a central row on which the interdigitated grooves 37 are aligned with a pitch of 0.635 mm.

What is claimed is:

1. In a connector comprising at least one contact having a resiliently deformable arm exterting a bearing force in the direction opposite the direction of insertion of a substantially planar substrate having contact pads on the planar surface facing said insertion direction, said contact being inserted longitudinally substantially parallel to the direction of insertion of said substrate in a socket formed in an insulating block, said contact having longitudinal generatrices, and comprising: a body cooperating with at least one edge of the socket so that, once the contact has been inserted, it has a longitudinal axis essentially parallel to the direction of the generatrices of the socket; said body having in section the general shape of a U defined by a bottom and two substantially planar legs, at least one of the legs being guided longitudinally over at least a part of its length by at least one lateral wall of the socket; an output terminal disposed at one longitudinal end of the body of the contact and extending from said socket; an extension forming an abutment for the contact against a surface of said insulating block to limit movement of the contact in the direction of insertion of the contact; a resilient retention tongue connected to said body, extending essentially in the longitudinal direction of said body, and cooperating with a stopping face of a retention cavity disposed in said socket so as to form an abutment in the direction opposite the direction of insertion of the contact; a spring arm connected to the other longitudinal end of said body and extending in a direction substantially parallel to the longitudinal axis of said body; said resiliently deformable arm extending from said socket for engagement with said substrate and comprising a lever projecting beyond the socket and extending from said spring arm the lever extending in a direction that is substantialy from one leg of the body towards and through the plane of the other leg.

2. The connector as claimed in claim 9, wherein said output terminal has, at the level of its connection with the body of the contact, a bend forming said abutment extension.

3. The connector as claimed in claim 2, wherein said bend comprises at least two portions.

4. The connector as claimed in claim 1, wherein the end of said resiliently deformable arm comprises a bump forming an electric contact zone.

5. The connector as claimed in any one of claims 1 to 4, wherein said socket comprises a slit for guiding said resiliently deformable arm, which allows free passage thereof during insertion of a contact, as well as transverse guiding thereof.

6. The connector as claimed in claim 5, wherein said slit comprises a zone forming a safety abutment for the resilient arm.

7. The connector as claimed in claim 6, wherein the abutment zone is formed by a set-back disposed on a transverse wall closing said slit.

8. The connector as claimed in claim 1, wherein said lever is connected to said spring arm by a bending zone disposed at the free end of the spring arm and on a lateral edge thereof.

9. The connector as claimed in claim 8, wherein said lever forms an obtuse angle with said spring arm, so that the maximum extension of the lever outside the socket is obtained at the end thereof.

10. The connector as claimed in claim 1, wherein said spring arm is separated from the body of a contact by a slit.

11. The connector as claimed in any one of claims 1, or 8 to 10, wherein the axis of said spring arm is slightly slanted laterally with respect to the longitudinal axis of the body of the contact so that the median plane of said lever passes substantially through the middle of the zone connecting said spring arm to the body of the contact.

12. The connector as claimed in claim 1, wherein the retention cavity has an edge running along the resilient retention tongue and cooperating with a lateral portion of the body so as to ensure guiding of the body.

13. The connector as claimed in claim 1, wherein a resilient means is provided for urging the body against a lateral wall of the socket.

14. The connector as claimed in claim 13, wherein said resilient means urges the body simultaneously against said lateral wall and said edge of the retention cavity.

15. The connector as claimed in claim 1, wherein said resiliently deformable arm has at least one portion parallel to the plane of the bottom of the U-shaped body and extending from the edge of one of the legs of the U-shaped body, opposite the bottom thereof.

16. The connector as claimed in claim 1, wherein the resilient retention tongue is disposed on one of the legs of the U-shaped body.

17. The connector as claimed in claim 1, wherein the output terminal is disposed at one end of one of the legs.

18. The connector as claimed in claim 1, wherein said resilient arm is disposed at the end of one of the legs as an extension thereof.

19. The connector as claimed in claim 17, wherein the output terminal is connected to one leg and the resiliently deformable arm at the end of the other leg as an extension thereof.

20. The connector as claimed in claim 19, wherein said resilient retention tongue is disposed on the same leg as the output terminal.

21. The connector as claimed in claim 1, wherein a resilient means is provided for urging said body against a lateral wall of the socket and wherein said resilient means is a resilient pressure tongue formed at one leg of the body.

22. The connector as claimed in claim 1, wherein the retention cavity has an edge running along the resilient retention tongue and cooperating with a lateral portion of the body so as to ensure guiding of the body, wherein a resilient means urges the body against a lateral wall of the socket and simultaneously against said edge of the cavity, and wherein said resilient means is a second resilient tongue formed on the leg of the body of the contact opposite that which carries the first resilient tongue.

23. The connector as claimed in claim 21 or 22, wherein said resilient pressure tongue is disposed at one end of said leg of the body.

24. The connector as claimed in claim 2, wherein said insulating block comprises at least one groove receiving said bend of the corresponding output terminal.

25. The connector as claimed in claim 1, comprising a plurality of contacts disposed in at least one row, the contacts disposed in the same row having output terminals with a bend forming said abutment extension and situated close to said body, and alternating with output terminals having a bend forming said abutment extension and having at least two portions so that the output terminals of said row extend in two rows.

* * * * *